(12) United States Patent
Yang et al.

(10) Patent No.: US 11,785,725 B2
(45) Date of Patent: Oct. 10, 2023

(54) DISPLAY DEVICE

(71) Applicant: Huawei Technologies Co., Ltd., Shenzhen (CN)

(72) Inventors: Jun Yang, Wuhan (CN); Qingzhi Yang, Wuhan (CN); Chia-Hsing Chung, Shenzhen (CN); Haitao Zhen, Wuhan (CN)

(73) Assignee: HUWEI TECHNOLOGIES CO., LTD., Shenzhen (CN)

( * ) Notice: Subject to any disclaimer, the term of this patent is extended or adjusted under 35 U.S.C. 154(b) by 306 days.

(21) Appl. No.: 17/290,822

(22) PCT Filed: Sep. 27, 2019

(86) PCT No.: PCT/CN2019/108592
§ 371 (c)(1),
(2) Date: Aug. 26, 2021

(87) PCT Pub. No.: WO2020/093814
PCT Pub. Date: May 14, 2020

(65) Prior Publication Data
US 2022/0087035 A1    Mar. 17, 2022

(30) Foreign Application Priority Data
Nov. 6, 2018   (CN) .......................... 201811315970.5

(51) Int. Cl.
*H05K 5/00*   (2006.01)
*H05K 1/02*   (2006.01)

(52) U.S. Cl.
CPC .......... *H05K 5/0017* (2013.01); *H05K 1/028* (2013.01); *H05K 2201/10128* (2013.01)

(58) Field of Classification Search
CPC .... H05K 5/0017; H05K 5/0217; H05K 1/028; H05K 2201/10128
USPC .......................................... 361/807
See application file for complete search history.

(56) References Cited

U.S. PATENT DOCUMENTS

| | | | |
|---|---|---|---|
| 2001/0002145 A1* | 5/2001 | Lee .................. | G02F 1/133308 349/58 |
| 2009/0047806 A1* | 2/2009 | Azuma ............. | G02F 1/133308 349/149 |
| 2013/0141664 A1* | 6/2013 | Toyoyama .............. | G09F 9/00 349/59 |
| 2015/0301391 A1 | 10/2015 | Li | |
| 2016/0259202 A1* | 9/2016 | Sugimoto ......... | G02F 1/133385 |
| 2017/0059926 A1* | 3/2017 | Kim ................ | G02F 1/133512 |
| 2018/0146572 A1 | 5/2018 | Park et al. | |

(Continued)

FOREIGN PATENT DOCUMENTS

| | | |
|---|---|---|
| CN | 103018937 A | 4/2013 |
| CN | 205091659 U | 3/2016 |
| CN | 106547140 A | 3/2017 |

(Continued)

*Primary Examiner* — Hung S. Bui
(74) *Attorney, Agent, or Firm* — Conley Rose, P.C.

(57) ABSTRACT

A display device includes a display panel, a drive board, and a flexible printed circuit board. A bezel located on one side of the display panel protrudes relative to a surface on which the display panel is mounted, and an accommodating cavity is formed in the protrusion. The drive board is fixed in the accommodating cavity, and the drive board and the display panel are disposed at an included angle.

20 Claims, 4 Drawing Sheets

(56) References Cited

U.S. PATENT DOCUMENTS

2022/0276681 A1* 9/2022 Zhu ................. G06F 1/1681

FOREIGN PATENT DOCUMENTS

| | | | |
|---|---|---|---|
| CN | 107193166 A | 9/2017 | |
| CN | 107195663 A | 9/2017 | |
| CN | 207249549 U | 4/2018 | |
| CN | 108109521 A | 6/2018 | |
| CN | 207571656 U | 7/2018 | |
| CN | 207676075 U | 7/2018 | |
| CN | 109493723 A | 3/2019 | |
| EP | 3855415 A | 7/2021 | |
| JP | 2004219720 * | 8/2004 | ............... G09F 9/00 |
| JP | 2007127962 A | 5/2007 | |
| JP | 2012123170 A | 6/2012 | |
| JP | 2013174705 A | 9/2013 | |
| KR | 20130122106 A | 11/2013 | |
| WO | 2013089030 A1 | 6/2013 | |

* cited by examiner

DISPLAY DEVICE

CROSS-REFERENCE TO RELATED APPLICATIONS

This application is a U.S. National Stage of International Patent Application No. PCT/CN2019/108592 filed on Sep. 27, 2019, which claims priority to Chinese Patent Application No. 201811315970.5 filed on Nov. 6, 2018. Both of the aforementioned applications are hereby incorporated by reference in their entireties.

TECHNICAL FIELD

This application relates to the field of electronic technologies, and in particular, to a display device.

BACKGROUND

Existing electronic products gradually tend to have narrow bezels, to not only increase a display area, but also achieve a good visual effect. Currently, corresponding to a display device such as a notebook computer or a television, a drive board that drives a display panel of the display device to perform display is parallel to the display panel and is disposed at a location of a lower bezel of the display device. To cover the drive board, a width of the lower bezel is restricted by a width of the drive board. As a result, a narrow bezel cannot be implemented.

SUMMARY

This application provides a display device on which a narrow bezel can be implemented.

The display device includes a display part. The display part includes a display panel, a bezel, a drive board, and a flexible printed circuit board electrically connected to the display panel and the drive board. The bezel is located on one side of the display panel and protrudes relative to a surface on which the display panel is located. An accommodating cavity is provided in the bezel. The drive board is fixed in the accommodating cavity, and the drive board and the display panel are disposed at an included angle. The drive board includes a front facet on which a connection line is disposed and a back facet. The flexible printed circuit board includes a first end, a second end, and a fixed section located between the first end and the second end. The second end is fixedly connected to the display panel. The fixed section is fixed to the back facet and faces the display panel. The first end is fixed to the front facet and is away from the display panel.

The drive board is disposed in the accommodating cavity, and the drive board and the display panel are disposed at the included angle. Therefore, the drive board and the display panel are disposed in a non-parallel manner, so that a projection of the drive board on a plane on which the display panel is located is reduced, and a width of a bezel used to cover the drive board can be reduced. Further, in this application, the first end of the flexible printed circuit board is fixed to the front facet of the drive board and is electrically connected to the connection line, and the fixed section is fixed to the back facet of the drive board, so that when the flexible printed circuit board is subsequently pulled, a force-bearing location on the flexible printed circuit board is the fixed section, and the first end is not pulled, thereby preventing the first end from being detached from the drive board due to pulling.

In some embodiments of this application, a section between the fixed section and the second end of the flexible printed circuit board is curved, so that a length of the flexible printed circuit board between the drive board and the display panel is greater than a distance between the drive board and the display panel, and the flexible printed circuit board has specific stretching space, thereby avoiding damage to the flexible printed circuit board due to pulling in a process in which the flexible printed circuit board is electrically connected to the drive board and the display panel, and facilitating installation of the drive board and the flexible printed circuit board in the display device.

In some embodiments of this application, the included angle between the drive board and the display panel is greater than or equal to 90°, to minimize the projection of the drive board on the plane on which the display panel is located, and minimize the width of the bezel. In addition, the included angle between the drive board and the display panel is greater than or equal to 90°, so that an angle formed by bending the section between the second end and the fixed section of the flexible printed circuit board is greater than or equal to 90°, thereby avoiding damage to the flexible printed circuit board due to an excessively large bending degree of the flexible printed circuit board.

In some embodiments of this application, the fixed section is fixed to the back facet by using an adhesive, the drive board includes a bottom facet and a top facet that are connected to the front facet and the back facet and that are disposed opposite to each other, the bottom facet is close to the display panel, the flexible printed circuit board extends from the front facet to the back facet through the top facet, and a thickness of the adhesive gradually increases in a direction from the top facet to the bottom facet. The thickness of the adhesive gradually increases in the direction from the top facet to the bottom facet, so that a specific angle is formed between the fixed section and the back facet, to increase the angle formed by bending the section between the second end and the fixed section of the flexible printed circuit board. Therefore, a bending degree of the flexible printed circuit board can be further reduced, thereby avoiding damage to the flexible printed circuit board due to an excessively large bending degree of the flexible printed circuit board.

In some embodiments of this application, the adhesive may include a plurality of sub-areas disposed at intervals in the direction from the top facet to the bottom facet. The plurality of sub-areas are used to fix the fixed section at a plurality of points, to achieve a better fixing effect. In addition, a section, between adjacent sub-areas, of the fixed section is curved, so that when one fixing point is detached, the curved fixed section can provide stretching space to avoid further detaching of another fixing point.

In some embodiments of this application, the drive board includes a bottom facet and a top facet that are connected to the front facet and the back facet and that are disposed opposite to each other, the bottom facet is close to the display panel, a groove is recessed on the top facet in a direction towards the bottom facet, and a part of the flexible printed circuit board is accommodated in the groove. The groove is provided on the top facet of the drive board, and the flexible printed circuit board extends to the back facet through the groove, so that the flexible printed circuit board does not protrude at an edge of the flexible printed circuit board when bypassing the drive board, thereby avoiding damage caused to the flexible printed circuit board by an inner wall of the accommodating cavity when the drive board is fixed in the accommodating cavity. Further, a fixing structure such as an adhesive may be disposed in the groove, so that a part of the flexible printed circuit board is fixed in the groove, thereby further avoiding detaching between the first end and the front facet when the flexible printed circuit board is pulled.

In some other embodiments of this application, a through-hole is provided on the drive board, and a section between the first end and the fixed section of the flexible printed circuit board passes the through-hole to extend to the back facet, so that a length of the flexible printed circuit board can be shortened, and damage caused to the flexible printed circuit board by the inner wall of the accommodating cavity can also be avoided.

Further, in some embodiments of this application, a buffer piece is disposed between the drive board and an inner wall of the bezel. The buffer piece provides buffering between the drive board and an inner wall of the protrusion, to avoid collision between the drive board and the inner wall of the protrusion when the display device encounters collision, and therefore avoid damage to the drive board.

Further, in some embodiments of this application, the bezel is made of a signal shielding material, or a shield layer is disposed on the inner wall or an outer wall of the protrusion, to shield an external signal by using the protrusion, and avoid interference from the external signal to a signal transmitted by the drive board.

In some embodiments of this application, the display device includes a backplane, the bezel protrudes relative to a surface on which the display panel is located to form a protrusion, the protrusion includes a first housing and a second housing, the first housing and the second housing are detachably fixed on the backplane, and the first housing, the second housing, and the backplane enclose the accommodating cavity. The protrusion is disposed as a structure including the first housing and the second housing. During installation of the drive board, the first housing can be first fixed on the backplane, then the drive board is fixed, and finally the second housing is fixed to the first housing, so that the drive board is fixed in the accommodating cavity of the protrusion. Therefore, the drive board can be installed conveniently. In addition, the drive board can also be conveniently removed from the accommodating cavity for maintenance and other operations.

Specifically, in an embodiment of this application, a front retaining wall and a rear retaining wall spaced apart from the front retaining wall are disposed on the backplane, one side of the drive board is sandwiched between the front retaining wall and the rear retaining wall, support ribs are disposed on inner walls of the first housing and the second housing, a first surface of the drive board is carried on the support rib of the first housing, and a second surface of the drive board is carried on the support rib of the second housing.

Further, in some embodiments of this application, the display device includes a rotating shaft and a functional part, the rotating shaft is accommodated in the accommodating cavity, and the rotating shaft is connected to the display part and the functional part, so that the display part and the functional part are rotatably connected. The rotating shaft is disposed in the protrusion, so that a structure of the display device is simplified. The rotating shaft is rotatably connected to the display part and the functional part, so that the display part and the functional part can be folded relative to each other, thereby extending a use function of the display device.

BRIEF DESCRIPTION OF DRAWINGS

To describe structural features and effects of this application more clearly, the following describes this application in detail with reference to accompanying drawings and specific embodiments.

DESCRIPTION OF EMBODIMENTS

The following clearly and completely describes the technical solutions in the embodiments of this application with reference to the accompanying drawings in the embodiments of this application.

This application provides a display device on which a narrow bezel can be implemented. The display device may be a notebook computer, or may be a display device such as a television or a tablet computer.

Figure 1:
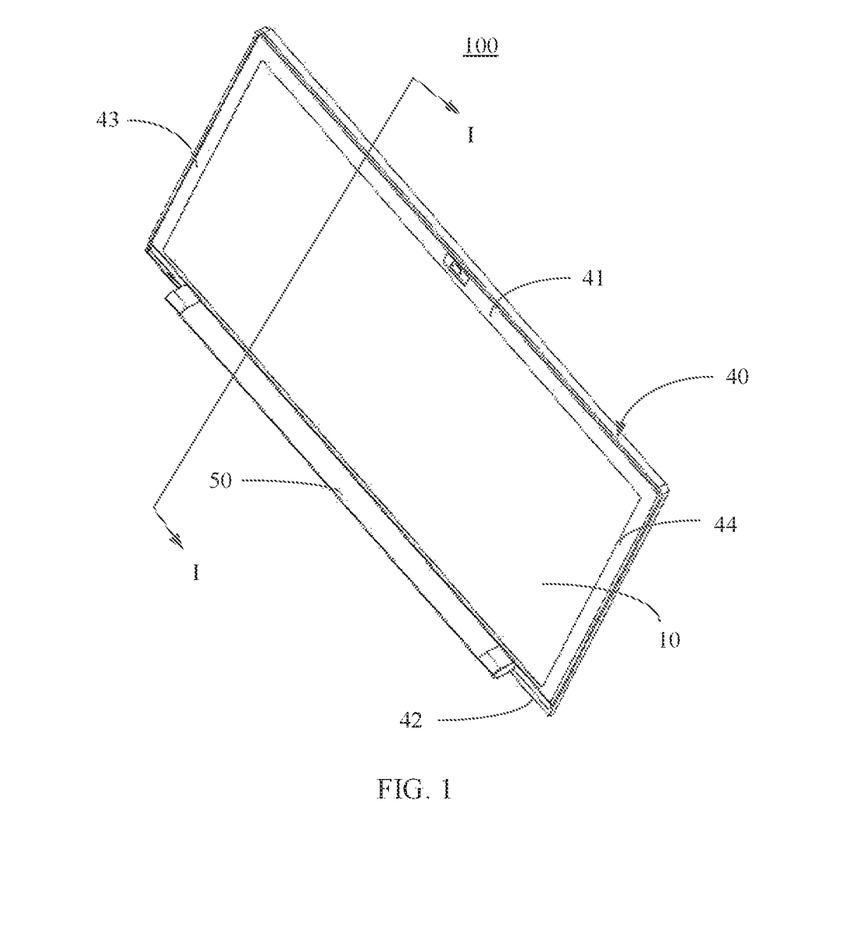
FIG. 1 is a schematic structural diagram of a display device according to an embodiment of this application.
Figure 2:
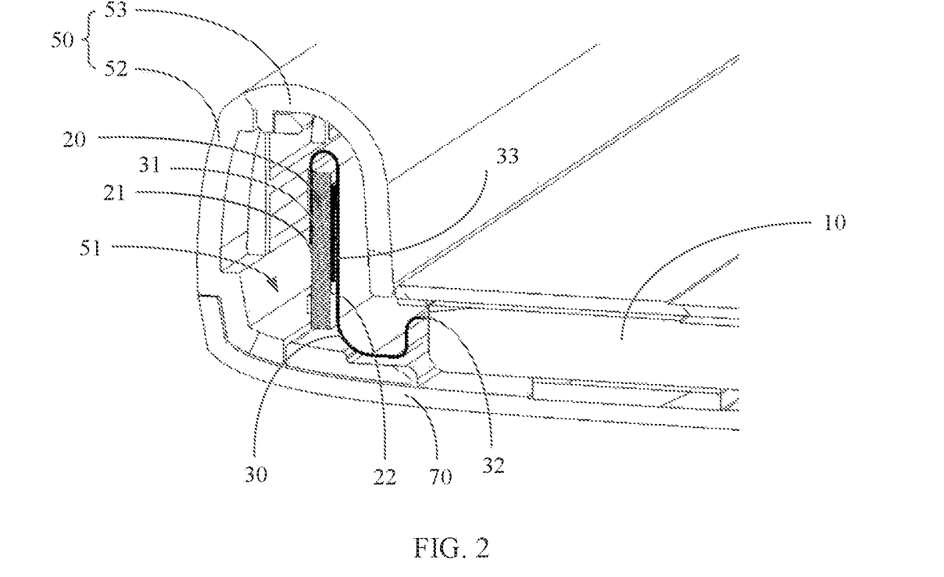
FIG. 2 is a schematic cross-sectional view of the display device in FIG. 1 in an I-I direction.

Referring to FIG. 1 and FIG. 2, this embodiment provides a display device. The display device includes a display part 100. The display part 100 includes a display panel 10, a drive board 20, and a flexible printed circuit board 30 electrically connected to the display panel 10 and the drive board 20. The drive board 20 provides a drive signal for the display panel 10 by using the flexible printed circuit board 30, to drive the display panel 10 to perform display. A bezel 40 is disposed around the display panel 10. On one side of the display panel 10, the bezel 40 protrudes from a surface on which the display panel 10 is located to form a protrusion 50. In this embodiment, the display panel 10 is a quadrilateral panel and includes four side edges. The bezel 40 includes an upper bezel 41, a lower bezel 42 opposite to the upper bezel 41, and a left bezel 43 and a right bezel 44 located between the upper bezel 41 and the lower bezel 42. The upper bezel 41, the lower bezel 42, the left bezel 43, and the right bezel 44 are separately located on sides at the four side edges of the display panel 10. In this embodiment, the lower bezel 42 protrudes from the surface on which the display panel 10 is located to form the protrusion 50. An accommodating cavity 51 is formed in the protrusion 50. The drive board 20 is fixed in the accommodating cavity 51, and the drive board 20 and the display panel 10 are disposed at an included angle. That the drive board 20 and the display panel 10 are disposed at an included angle means that the drive board 20 and the display panel 10 are disposed at a specific included angle.

The drive board 20 is disposed in the accommodating cavity 51 of the protrusion 50 that protrudes from a plane on which the display panel 10 is located, so that the drive board 20 and the display panel 10 can be disposed at the included angle. Therefore, a projection of the drive board 20 on the plane on which the display panel 10 is located is reduced, and a width of the bezel 40 used to cover the drive board 20 can be reduced.

Figure 3:
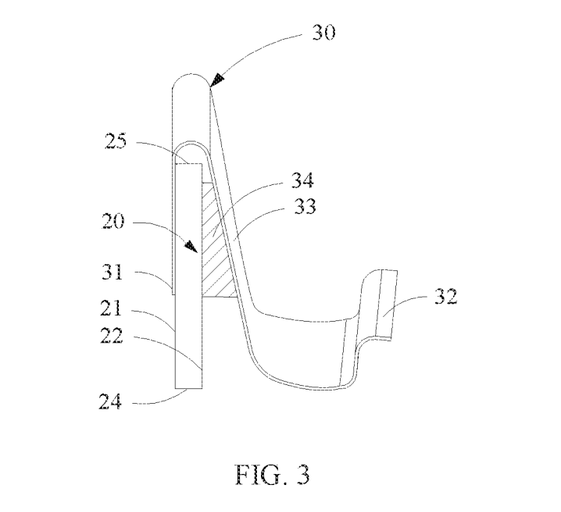
FIG. 3 is a schematic cross-sectional view of a fixing structure of a flexible printed circuit board and a drive board in a direction perpendicular to a length direction of the drive board according to an embodiment of this application.

Referring to FIG. 2 and FIG. 3, the drive board 20 includes a front facet 21 and a back facet 22 opposite to the front facet 21. In this embodiment, the drive board 20 is a PCB. It can be understood that the PCB board may be a single-sided PCB board, or may be a double-sided PCB or a multi-layer PCB. In this embodiment, the drive board 20 is a single-sided PCB, and a connection line is disposed on the front facet of the drive board 20. The flexible printed circuit board 30 includes a first end 31 fixed to the front facet 21 of the drive board 20, a second end 32 connected to the display panel 10, and a fixed section 33 located between the first end 31 and the second end 32. The fixed section 33 is fixed to the back facet 22 of the drive board 20. Specifically, the first end 31 of the flexible printed circuit board 30 is fixed to the front facet 21 and is electrically connected to the connection line on the front facet 21, to provide a display signal for the display panel 10 through the connection line. The flexible printed circuit board 30 extends from the front facet 21 to the back facet 22 through a side facet of the drive board 20, and the fixed section 33 is fixed to the back facet 22, so that when the flexible printed circuit board 30 is subsequently pulled, a force-bearing location on the flexible printed circuit board 30 is the fixed section 33, and the first end 31 is not pulled, thereby preventing the first end 31 from being detached from the drive board 20 due to pulling.

Manners of fixing the fixed section 33 to the back facet 22 include but are not limited to fixing by using bonding glue such as an adhesive, clamping, and other fixing manners. Referring to FIG. 3, in an embodiment of this application, the fixed section 33 is fixed to the back facet 22 by using an adhesive 34. The drive board 20 includes a bottom facet 24 and a top facet 25 that are connected to the front facet 21 and the back facet 22 and that are disposed opposite to each other. The bottom facet 24 is close to the display panel 10. The flexible printed circuit board 30 extends from the front facet 21 to the back facet 22 through the top facet 25. A thickness of the adhesive 34 gradually increases in a direction from the top facet 25 to the bottom facet 24. The thickness of the adhesive gradually increases in the direction from the top facet 25 to the bottom facet 24, so that a specific angle is formed between the fixed section 33 and the back facet 22, to increase an angle formed by bending a section between the second end 32 and the fixed section 33 of the flexible printed circuit board 30. Therefore, a bending degree of the flexible printed circuit board 30 can be further reduced, thereby avoiding damage to the flexible printed circuit board 30 due to an excessively large bending degree of the flexible printed circuit board 30.

Figure 4:
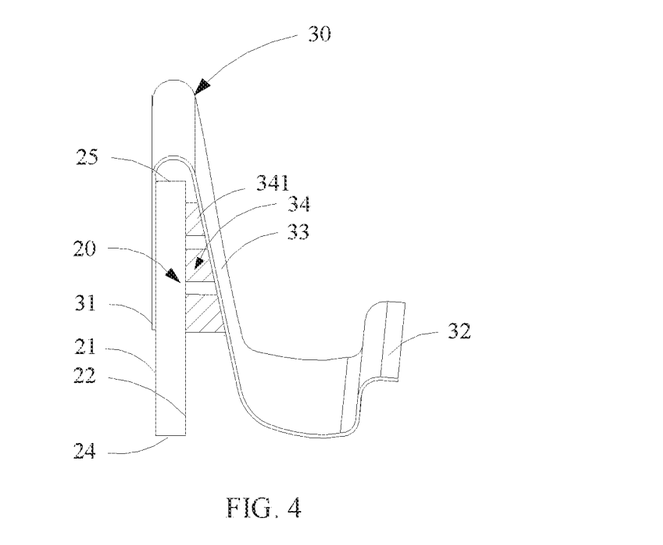
FIG. 4 is a schematic cross-sectional view of a fixing structure between a flexible printed circuit board and a drive board in a direction perpendicular to a length direction of the drive board according to another embodiment of this application.

Referring to FIG. 4, in some embodiments of this application, the adhesive 34 may include a plurality of sub-areas 341 disposed at intervals in the direction from the top facet 25 to the bottom facet 24. The plurality of sub-areas 341 are used to fix the fixed section 33 at a plurality of points, to achieve a better fixing effect. In addition, a section, between adjacent sub-areas 341, of the fixed section 33 is curved, so that when one fixing point is detached, the curved fixed section 33 can provide stretching space to avoid further detaching of another fixing point, to achieve a better fixing effect.

Figure 5:
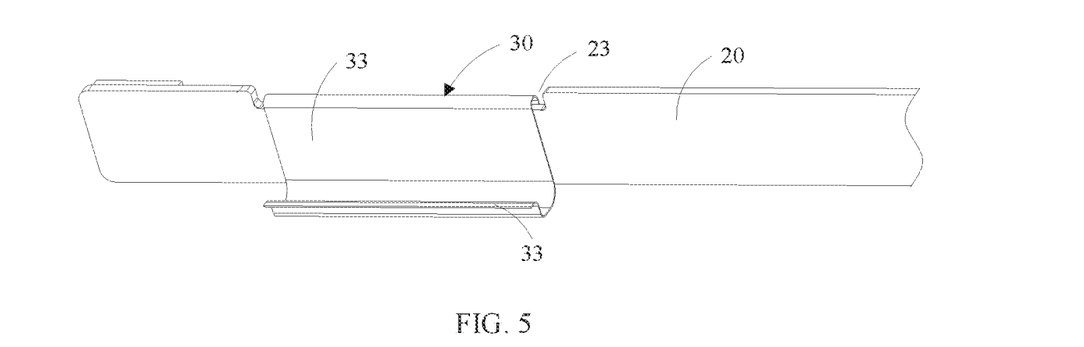
FIG. 5 is a schematic front view of a fixing structure between a flexible printed circuit board and a drive board according to an embodiment of this application.

Referring to FIG. 5, in some embodiments of this application, a groove 23 is provided at a side edge of the drive board 20, and a section between the first end 31 and the fixed section 33 of the flexible printed circuit board 30 extends from the front facet 21 to the back facet 22 through the groove 23. The groove 23 is provided at the side edge of the drive board 20, and the flexible printed circuit board 30 extends to the back facet 22 through the groove 23, so that the flexible printed circuit board 30 does not protrude at an edge of the flexible printed circuit board 30 when bypassing the drive board 20, thereby avoiding damage caused to the flexible printed circuit board 30 by an inner wall of the accommodating cavity 51 when the drive board 20 is fixed in the accommodating cavity 51.

Further, in some embodiments, a length of the groove 23 is the same as a width of the flexible printed circuit board 30, so that when the flexible printed circuit board 30 extends to the back facet 22 through the groove 23, the flexible printed circuit board 30 is properly clamped in the groove 23. This avoids a case in which a portion between the first end 31 and the fixed section 33 moves along a length direction of the drive board 20 and therefore the first end 31 is detached from the drive board 20. The length direction of the drive board 20 is the same as a length direction of an edge, corresponding to the lower bezel 42, of the display panel.

In some other embodiments of this application, a fixing structure such as an adhesive may be disposed in the groove 23, so that a part of the flexible printed circuit board 30 is fixed in the groove 23, thereby further avoiding detaching between the first end 31 and the front facet 21 when the flexible printed circuit board 30 is pulled.

In some other embodiments of this application, a through-hole is provided on the drive board 20, and a section between the first end 31 and the fixed section 33 of the flexible printed circuit board 30 passes the through-hole to extend to the back facet 22, so that a length of the flexible printed circuit board 30 can be shortened. In addition, the flexible printed circuit board 30 can be prevented from protruding at an edge of the flexible printed circuit board 30 when bypassing the drive board 20, thereby avoiding damage caused to the flexible printed circuit board 30 by an inner wall of the accommodating cavity 51 when the drive board 20 is fixed in the accommodating cavity 51. In an embodiment, a length direction of the through-hole is the same as a length direction of the drive board 20, and a length of the through-hole is the same as a width of the flexible printed circuit board 30, so that when the flexible printed circuit board 30 extends to the back facet 22 through the through-hole, the flexible printed circuit board 30 is properly clamped in the through-hole. This avoids a case in which a portion between the first end 31 and the fixed section 33 moves along the length direction of the drive board 20 and therefore the first end 31 is detached from the drive board 20.

Further, still referring to FIG. 2 to FIG. 4, in some embodiments of this application, a section between the fixed section 33 and the second end 32 of the flexible printed circuit board 30 is curved, so that a length of the flexible printed circuit board 30 between the drive board 20 and the display panel 10 is greater than a distance between the drive board 20 and the display panel 10, and the flexible printed circuit board 30 has specific stretching space, thereby avoiding damage to the flexible printed circuit board 30 due to pulling in a process in which the flexible printed circuit board 30 is electrically connected to the drive board 20 and the display panel 10.

In some embodiments of this application, the included angle between the drive board 20 and the display panel 10 is greater than or equal to 90°, to minimize the projection of the drive board 20 on the plane on which the display panel 10 is located, and minimize the width of the bezel 40. In addition, the included angle between the drive board 20 and the display panel 10 is greater than or equal to 90°, so that an angle formed by bending the section between the fixed section 33 and the second end 32 of the flexible printed circuit board 30 is greater than or equal to 90°, thereby avoiding damage to the flexible printed circuit board 30 due to an excessively large bending degree of the flexible printed circuit board 30. Preferably, the included angle between the drive board 20 and the display panel 10 is 90°, so that the width of the bezel 40 is minimized.

Figure 6:
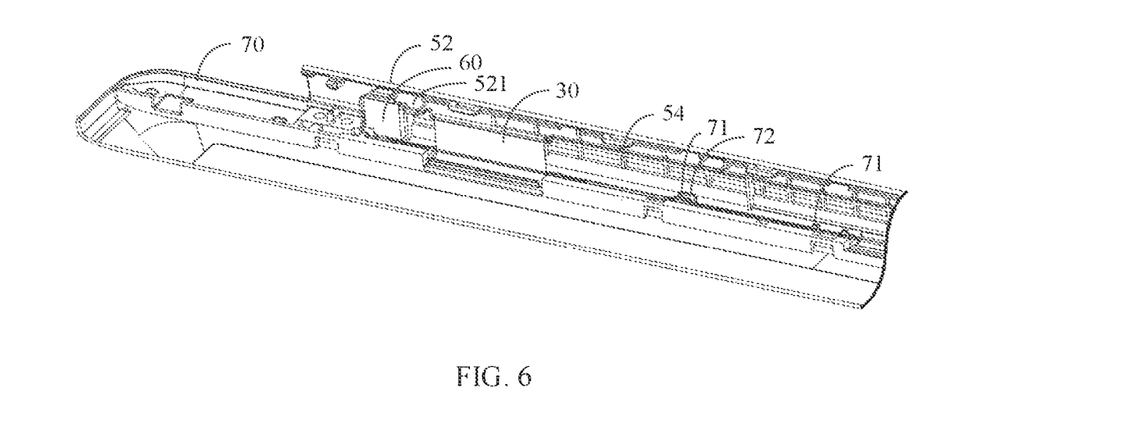
FIG. 6 is a schematic structural diagram of an accommodating cavity of the protrusion according to an embodiment of this application.

Further, referring to FIG. 6, in some embodiments of this application, a buffer piece 60 is disposed between the drive board 20 and an inner wall of the protrusion 50. The buffer piece 60 provides buffering between the drive board 20 and the inner wall of the protrusion 50, to avoid collision between the drive board 20 and the inner wall of the protrusion 50 when the display device 100 encounters collision, and therefore avoid damage to the drive board 20. In some embodiments of this application, there are a plurality of buffer pieces 60, and the plurality of buffer pieces 60 are disposed at intervals along the length direction of the drive board 20, to support the drive board 20 at a plurality of points, so that a comparatively good heat dissipation effect can be achieved while buffering is implemented between the drive board 20 and the inner wall of the protrusion 50. In this embodiment, the buffer piece 60 may be a rubber piece. The buffer piece 60 is fixed on the inner wall of the protrusion 50. After the drive board 20 is fixed in the accommodating cavity of the protrusion 50, the buffer piece 60 abuts against the front facet 21 and the back facet 22 of the drive board 20.

Further, in some embodiments of this application, the protrusion 50 is made of a signal shielding material, or a shield layer is disposed on the inner wall or an outer wall of the protrusion 50, to shield an external signal by using the protrusion 50, and avoid interference from the external signal to a signal transmitted by the drive board 20. In this embodiment, the protrusion 50 is made of a plastic material, and the inner wall of the protrusion 50 is coated with a metal shield layer, to shield an external signal.

Referring to FIG. 2 and FIG. 6, the display device 100 further includes a backplane 70, and the outer wall of the protrusion 50 is detachably fixed to the backplane 70. The protrusion 50 includes a first housing 52 and a second housing 53 that are detachably connected. The first housing 52 and the second housing 53 are detachably fixed on the backplane 70. The first housing 52, the second housing 53, and the backplane 70 enclose the accommodating cavity 51. Specifically, the first housing 52 may be connected to the second housing 53 in a detachable fixing manner, for example, fixing by using a clip or fixing by using a screw. The protrusion 50 is disposed as the first housing 52 and the second housing 53 that are detachably connected. During installation of the drive board 20, the first housing 52 can be first fixed on the backplane 70, then the drive board 20 is fixed, and finally the second housing 53 is fixed to the first housing 52, so that the drive board 20 is fixed in the accommodating cavity 51 of the protrusion 50. In other words, the protrusion 50 is disposed as a structure formed by connecting the first housing 52 and the second housing 53, so that the drive board 20 can be conveniently installed in the accommodating cavity 51 and connected to the display panel 10, and the drive board 20 can be conveniently replaced or repaired.

Specifically, still referring to FIG. 6, in an embodiment of this application, a front retaining wall 71 and a rear retaining wall 72 spaced apart from the front retaining wall 71 are disposed at a location that is on the backplane 70 and that corresponds to the protrusion 50, and a side that is of the drive board 20 and that faces the backplane 70 is sandwiched between the front retaining wall 71 and the rear retaining wall 72. Specifically, the front retaining wall 71 and the rear retaining wall 72 are protruding columns that protrude from an inner surface of the backplane 70, and there are a plurality of front retaining walls 71 and rear retaining walls 72. The plurality of front retaining walls 71 are located on a side of the front facet 21 of the drive board 20 and are disposed at intervals along the length direction of the drive board 20. The plurality of rear retaining walls 72 are located on a side of the back facet 22 of the drive board 20 and are disposed at intervals along the length direction of the drive board 20. The drive board 20 is sandwiched between the plurality of front retaining walls 71 and the plurality of rear retaining walls 72, so that all locations on the drive board 20 can be properly fixed to the backplane 70. Further, a hook 521 protrudes on the first housing 52, and a side that is of the drive board 20 and that is away from the backplane 70 is fixed to the first housing 52 by using the hook 521. The drive board 20 is fixed in the accommodating cavity 51 of the protrusion 50 by using the hook on the first housing 52 and by using the front retaining wall 71 and the rear retaining wall 72 on the backplane 70. Finally, the second housing 53 is fixed to the first housing 52, to keep the accommodating cavity 51 sealed, and prevent external impurities from entering the accommodating cavity 51.

Further, support ribs 54 are disposed on inner walls of the first housing 52 and the second housing 53. The support rib 54 of the first housing 52 abuts against the front facet 21 of the drive board 20. The support rib 54 of the second housing 53 abuts against the back facet 22 of the drive board 20. There are a plurality of support ribs 54 on each of the inner walls of the first housing 52 and the second housing 53. The plurality of support ribs 54 are disposed at intervals along the length direction of the drive board 20, to support all locations on the drive board 20 by using the support ribs 54 on the inner walls of the first housing 52 and the second housing 53, and ensure stability of the drive board 20 in the accommodating cavity 51.

Figure 7:
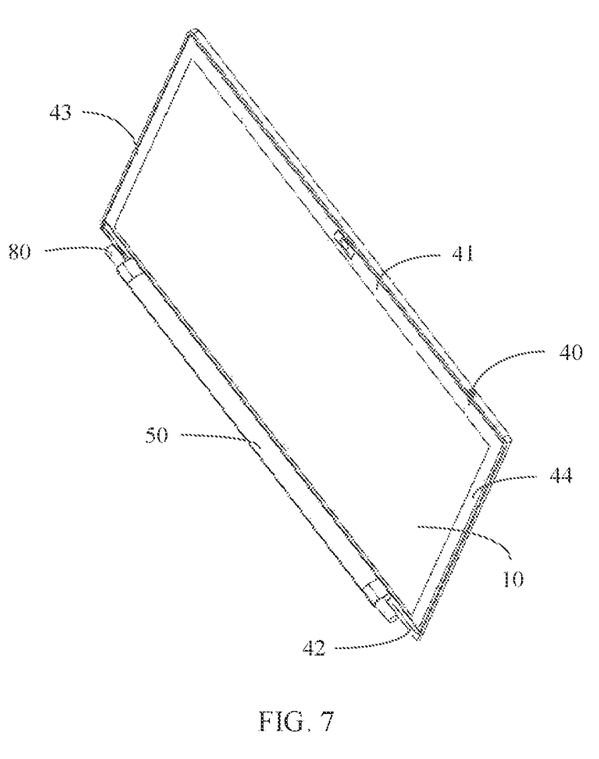
FIG. 7 is a schematic structural diagram of a display device according to another embodiment of this application.

Further, referring to FIG. 7, in some embodiments of this application, the display device 100 includes a rotating shaft 80, the rotating shaft 80 is accommodated in the protrusion 50, and two ends of the protrusion 50 extend out of the protrusion 50. The rotating shaft 80 is disposed in the protrusion 50, so that a structure of the display device is simplified. For a display device with a rotating shaft structure, such as a notebook computer, the protrusion 50 is a rotating shaft cover of a mounting rotating shaft in the current technology. In this application, the drive board 20 is disposed in the rotating shaft cover, to reduce the bezel of the display device without increasing the structure of the display device. It can be understood that, in another embodiment of this application, when the display device is a display device without a rotating shaft, such as a television or a tablet computer, the protrusion 50 may be a structure such as a television base, or the protrusion 50 is formed by protruding, by a location that is on the backplane and that corresponds to the lower bezel, from a plane on which the backplane is located, so that the display device has good appearance.

Further, the display device further includes a functional part, the rotating shaft 80 is connected to the display part 100 and the functional part, so that the display part 100 and the functional part are rotatably connected. The rotating shaft 80 is rotatably connected to the display part 100 and the functional part, so that the display part 100 and the functional part can be folded relative to each other, thereby extending a use function of the display device. For example, when the display device is a notebook computer, the functional part is a keyboard of the notebook computer.

The foregoing descriptions are merely preferred implementations of this application. It should be noted that a person of ordinary skill in the art may make several improvements or polishing without departing from the principle of this application and the improvements or polishing shall fall within the protection scope of this application.

The invention claimed is:

1. A display device comprising:
a display part comprising:
  a display panel mounted on a surface;
  a drive board, wherein the drive board and the display panel are disposed at an included angle, and wherein the drive board comprises:
    a front facet;
    a back facet;
    a bottom facet coupled to the front facet and the back facet and disposed proximate to the display panel; and
    a top facet coupled to the front facet and the back facet and disposed opposite to the bottom facet;
  a flexible printed circuit board extending from the front facet to the top facet and to the back facet and electrically coupled to the display panel and the drive board and comprising:
    a first end fixed to the front facet;
    a second end fixed to the display panel; and
    a fixed section located between the first end and the second end, affixed to the back facet by an adhesive, and facing in the direction of the display panel; and
  a bezel disposed around the display panel and configured to protrude relative to the surface on which the display panel is mounted, wherein the bezel comprises an accommodating cavity, and
  wherein the drive board is disposed within the accommodating cavity.

2. The display device of claim 1, wherein a section of the flexible printed circuit board between the fixed section and the second end is curved.

3. The display device of claim 1, wherein the included angle is greater than 90°.

4. The display device of claim 1, wherein the included angle is equal to 90°.

5. The display device of claim 1, wherein a thickness of the adhesive increases in a first direction from the top facet to the bottom facet.

6. The display device of claim 1, wherein the adhesive comprises a plurality of sub-areas disposed at intervals in the first direction.

7. The display device of claim 1, wherein the drive board further comprises:
  a bottom facet coupled to the front facet and the back facet and disposed proximate to the display panel; and
  a top facet coupled to the front facet and the back facet and disposed opposite to the bottom facet.

8. The display device of claim 7, further comprising a groove recessed on the top facet in a second direction towards the bottom facet, wherein a part of the flexible printed circuit board is accommodated in the groove.

9. The display device of claim 1, wherein the drive board further comprises a through-hole, and wherein a section of the flexible printed circuit board between the first end and the fixed section passes through the through-hole to the back facet.

10. The display device of claim 1, further comprising a buffer piece disposed between the drive board and an inner wall of the bezel.

11. The display device of claim 1, wherein the bezel comprises a signal shielding material.

12. The display device of claim 1, further comprising a shield layer disposed on an inner wall of the bezel.

13. The display device of claim 1, further comprising a shield layer disposed on an outer wall of the bezel.

14. The display device of claim 1, further comprising a backplane, wherein the bezel is further configured to further protrude relative to the surface on which the display panel is mounted to form a protrusion, and wherein the protrusion comprises:
  a first housing detachably fixed on the backplane; and
  a second housing detachably fixed on the backplane.

15. The display device of claim 14, wherein the first housing, the second housing, and the backplane enclose the accommodating cavity.

16. The display device of claim 15, further comprising:
  a hook protruding from the first housing;
  a front retaining wall disposed on the backplane; and
  a rear retaining wall spaced apart from the front retaining wall and disposed on the backplane, wherein the drive board is sandwiched between the front retaining wall and the rear retaining wall, and wherein the drive board is affixed to the first housing by the hook.

17. The display device of claim 16, further comprising:
  a first support rib disposed on an inner wall of the first housing and configured to abut against the front facet; and
  a second support rib disposed on an inner wall of the second housing and configured to abut against the back facet.

18. The display device of claim 1, further comprising:
  a functional part; and
  a rotating shaft accommodated in the accommodating cavity and rotatably coupled to the display part and the functional part.

19. An apparatus comprising:
  a display part comprising:
    a display panel mounted on a surface;
    a drive board, wherein the drive board and the display panel are disposed at an included angle, and wherein the drive board comprises:
      a front facet;
      a back facet;
    a flexible printed circuit board electrically coupled to the display panel and the drive board and comprising:
      a first end fixed to the front facet;
      a second end fixed to the display panel; and
      a fixed section located between the first end and the second end, affixed to the back facet and facing in the direction of the display panel; and
    a bezel disposed around the display panel and configured to protrude relative to the surface on which the display panel is mounted, wherein the bezel comprises an accommodating cavity, and wherein the drive board is disposed within the accommodating cavity;
  a functional part; and
  a rotating shaft rotatably coupled to the display part and the functional part.

20. The apparatus of claim 19, wherein the functional part comprises a keyboard.

\* \* \* \* \*